(12) United States Patent
Lichtenberg et al.

(10) Patent No.: US 11,846,474 B2
(45) Date of Patent: Dec. 19, 2023

(54) COOLING ARRAY

(71) Applicant: Lisa Draexlmaier GmbH, Vilsbiburg (DE)

(72) Inventors: Erwin Lichtenberg, Scharnstein (AT); Christian Goestl, Vilsbiburg (DE); Christian Friedrich, Landshut (DE)

(73) Assignee: LISA DRAEXLMAIER GMBH, Vilsbiburg (DE)

( * ) Notice: Subject to any disclaimer, the term of this patent is extended or adjusted under 35 U.S.C. 154(b) by 0 days.

(21) Appl. No.: 17/316,075

(22) Filed: May 10, 2021

(65) Prior Publication Data

US 2021/0356217 A1 Nov. 18, 2021

(30) Foreign Application Priority Data

May 12, 2020 (DE) .................... 10 2020 112 809.6

(51) Int. Cl.
  *F28F 3/04* (2006.01)
  *F28D 21/00* (2006.01)
(52) U.S. Cl.
  CPC ........ *F28F 3/04* (2013.01); *F28D 2021/0029* (2013.01); *F28F 2275/025* (2013.01); *F28F 2275/06* (2013.01); *F28F 2275/085* (2013.01)
(58) Field of Classification Search
  CPC ............. F28F 2275/025; F28F 2275/06; F28F 2275/085; F28F 3/02; F28F 3/04; F28F 13/00; F28D 2021/0029; H01L 23/3672; H01L 23/42; H01L 23/44; H01L 23/46; H01L 23/49568; H05K 7/20

USPC ....... 165/185; 361/688, 679.01, 679.54, 704, 361/707, 709, 710, 711
See application file for complete search history.

(56) References Cited

U.S. PATENT DOCUMENTS

| | | | | |
|---|---|---|---|---|
| 5,548,482 A | * | 8/1996 | Hatauchi | H01L 23/4093 257/713 |
| 6,229,702 B1 | * | 5/2001 | Tao | H01L 23/4334 257/796 |
| 7,498,673 B2 | * | 3/2009 | Awad | H01L 23/4093 174/548 |
| 8,014,150 B2 | * | 9/2011 | Campbell | H05K 7/203 165/185 |
| 8,194,406 B2 | * | 6/2012 | Campbell | H05K 7/20827 361/698 |
| 8,415,809 B2 | * | 4/2013 | Kang | H01L 21/565 438/126 |
| 8,710,640 B2 | * | 4/2014 | Choi | H01L 21/563 257/730 |
| 8,953,320 B2 | * | 2/2015 | Campbell | F28D 15/046 165/185 |
| 10,966,352 B2 | * | 3/2021 | Iyengar | H01L 23/427 |
| 2004/0085728 A1 | * | 5/2004 | Barth | H05K 7/20445 361/715 |

(Continued)

*Primary Examiner* — Len Tran
*Assistant Examiner* — Gustavo A Hincapie Serna
(74) *Attorney, Agent, or Firm* — Burris Law, PLLC

(57) ABSTRACT

A cooling array for cooling of an electronic component includes the electronic component, a housing which at least partially encloses the electronic component, a heat sink support connected to the housing in a fluid-tight manner, and a heat sink which is accommodated in the heat sink support. The heat sink is thermally coupled to the electronic component in order to disperse heat generated by the electronic component.

16 Claims, 5 Drawing Sheets

(56) References Cited

U.S. PATENT DOCUMENTS

Figure 1:
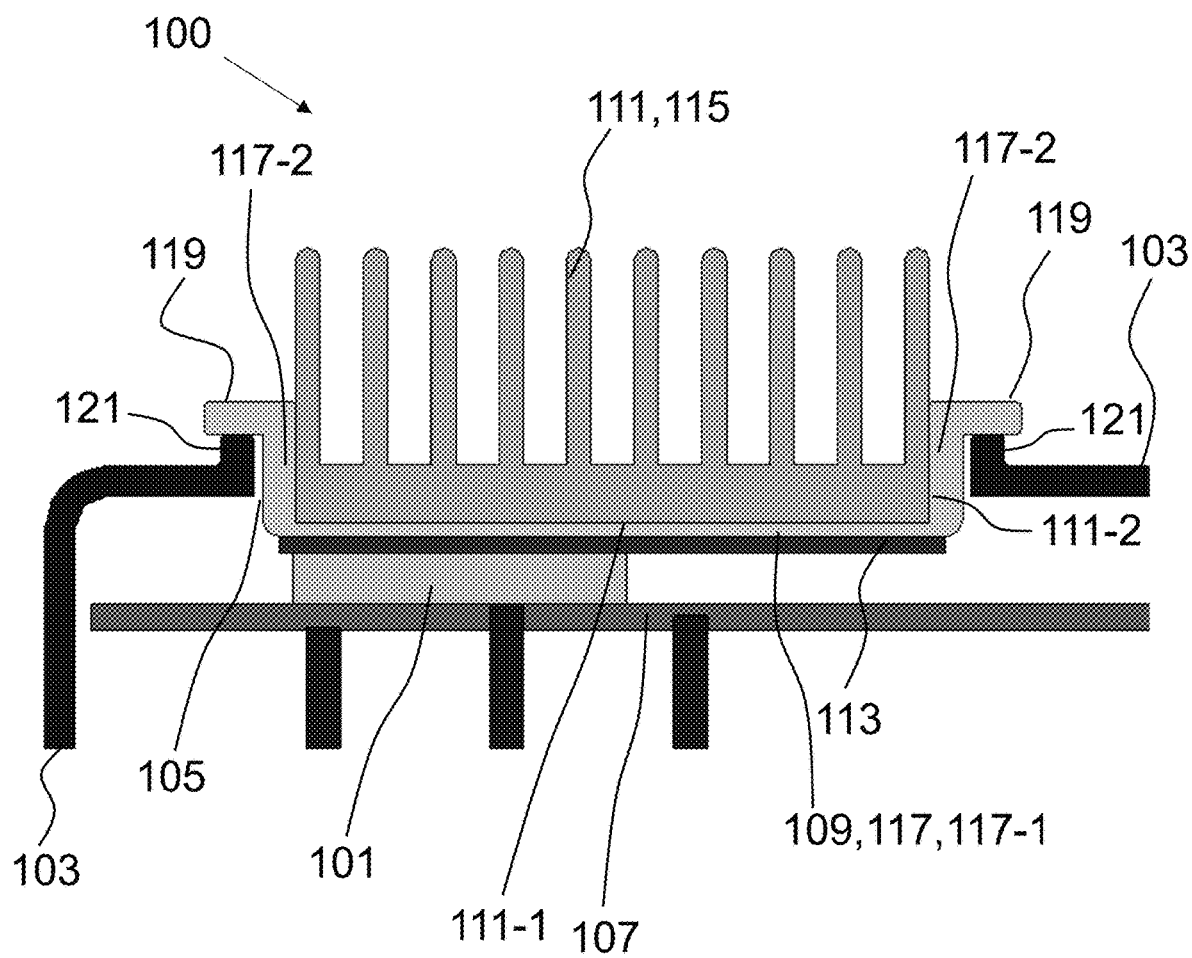

| | | | |
|---|---|---|---|
| 2005/0280140 A1* | 12/2005 | Corbin, Jr. | H01L 23/367 257/713 |
| 2007/0210438 A1* | 9/2007 | Briere | H01L 23/495 257/E23.092 |
| 2008/0180914 A1* | 7/2008 | Khanna | H01L 23/473 361/704 |
| 2008/0290505 A1* | 11/2008 | Kolan | H01L 23/3128 257/E23.101 |
| 2009/0283902 A1* | 11/2009 | Bezama | H01L 23/3675 257/713 |
| 2010/0019379 A1* | 1/2010 | Zhao | H01L 23/3675 257/E21.705 |
| 2010/0220446 A1* | 9/2010 | Tabei | H01L 23/3737 361/707 |
| 2010/0328889 A1* | 12/2010 | Campbell | H05K 7/20809 361/699 |
| 2011/0228498 A1* | 9/2011 | Kawai | H05K 7/20854 361/752 |
| 2012/0043669 A1* | 2/2012 | Refai-Ahmed | H01L 23/49827 438/109 |
| 2014/0284040 A1* | 9/2014 | Colgan | H01L 23/373 165/185 |
| 2015/0109735 A1* | 4/2015 | Campbell | H05K 7/2079 361/700 |
| 2016/0165755 A1* | 6/2016 | Bodenweber | H05K 1/181 165/80.2 |
| 2017/0148767 A1* | 5/2017 | Hung | H01L 25/0657 |
| 2019/0014690 A1* | 1/2019 | Miura | H01M 10/655 |
| 2019/0096784 A1* | 3/2019 | Katayama | H01L 23/051 |
| 2019/0162484 A1* | 5/2019 | Schlottig | H01L 23/3675 |
| 2021/0043537 A1* | 2/2021 | Faneuf | G11C 5/06 |

\* cited by examiner

COOLING ARRAY

CROSS-REFERENCE TO RELATED APPLICATIONS

This application claims priority to and the benefit of DE 10 2020 112 809.6, filed on May 12, 2020. The disclosure of the above application is incorporated herein by reference.

FIELD

The present disclosure relates to a cooling array for cooling of an electronic component.

BACKGROUND

The statements in this section merely provide background information related to the present disclosure and may not constitute prior art.

Conventionally, electronic components generate heat during operation which must be effectively dispersed from the electronic components in order to avoid overheating of the electronic components.

If the electronic component is in particular a component of a cup housing for receiving a fluid, in the frequent event of insufficient fluid sealing, fluid can come into contact with the electronic component, which can sometimes lead to undesired problems.

SUMMARY

This section provides a general summary of the disclosure and is not a comprehensive disclosure of its full scope or all of its features.

The present disclosure includes a cooling array for cooling of an electronic component which provides an effective fluid seal with respect to the electronic component.

The present disclosure is based on the understanding that the heat sink is not directly connected to the electronic component, but rather that the heat sink is contained in a heat sink support, which is at least partially connected in a fluid-tight manner to the housing that surrounds the electronic component. Because of this, only one sealing location must be formed in a fluid-tight manner between the heat sink support and the housing.

Furthermore, the heat sink and the heat sink support should be effectively fitted to one another such that any laborious post-processing of the heat sink before it is inserted into the heat sink support can be reduced, and component tolerances can be better compensated. Additionally, a scalable heat sink kit can be provided, from which the appropriate heat sink can be chosen based on the required cooling application.

According to a first aspect of the present disclosure, a cooling array for cooling of an electronic component comprises the electronic component, a housing which at least partially encompasses the electronic component, a heat sink support which is connected to the housing in a fluid-tight manner, and a heat sink which is accommodated by the heat sink support, wherein the heat sink is thermally coupled to the electronic component in order to disperse heat generated by the electronic component.

This achieves the technical advantage that the heat sink support is connected to the housing via an effective fluid-tight connection, and that the heat sink which is disposed within the heat sink support can effectively disperse heat generated by the electronic component.

The electronic component comprises in particular a power distributor or a circuit breaker.

The electronic component is disposed in particular within the housing on a support element.

The housing is manufactured in particular from a plastic.

The housing separates in particular an inner housing space from an outer housing space, wherein in particular the electronic component is disposed in the inner housing space, and wherein in particular the heat sink is disposed in the outer housing space.

The heat sink is manufactured in particular at least partially from a metal or a metal alloy, in particular aluminum.

The heat sink support is manufactured in particular from a plastic.

The heat sink support, in particular the heat sink support and the heat sink disposed within the heat sink support, seals the housing in particular in a fluid-tight manner.

In one form, the fluid-tight connection between the heat sink support and the housing comprises at least one of the following connections: a materially-bonded connection, such as a welded connection and/or a glued connection; a friction-locking connection, such as a screw connection or a snap connection, and/or a form-fitting connection, such as a clip connection and/or a caulked connection.

Thus an attained advantage is that effective sealing properties between the heat sink support and the housing can be obtained via the use of various connection methods, so that an individualized adjustment of the sealing properties can be undertaken.

With normal requirements for fluid-tightness, the fluid-tight connection between the heat sink support and the housing can comprise in particular a friction-locking connection, in particular a screw connection or a snap connection, and/or a form-fitting connection, in particular a clip connection and/or a caulked connection.

For particularly strict requirements for fluid-tightness, the fluid-tight connection between the heat sink support and the housing can in particular comprise a materially-bonded connection, in particular a welded connection and/or a glued connection.

In one form, a sealing element is disposed between the heat sink support and the housing in order to generate a fluid-tight connection between the heat sink support and the housing, wherein the sealing element comprises in particular a labyrinth seal and/or a two-component seal.

A sealing element, which comprises in particular a labyrinth seal and/or a two-component seal, provides a particularly effective fluid-tightness between the heat sink support and the housing. In one form, a corresponding sealing element can in particular comprise at least partially silicone.

In one form, the heat sink support is formed as a heat sink support tray, which features a tray base with a heat sink underside of the heat sink resting thereon, and which features a tray side wall which at least partially surrounds the tray base, with one heat sink lateral side of the heat sink resting thereon, wherein the tray side wall is connected to the housing in a fluid-tight manner.

With the development of the heat sink support as a heat sink support tray, a particularly effective accommodation of the heat sink within the heat sink support tray is now possible, so that no additional machining of the heat sink is required. Additionally, a heat sink which is formed more economically as an injection-molded part can be used. Additionally, a particularly fluid-tight connection between the tray side wall and the housing is provided.

In one form, the tray base features a lesser thickness than the tray side wall in order to make possible a particularly effective thermal coupling between the electronic component and the heat sink through the tray base.

In one form, the heat sink support is formed as a heat sink support frame, which features a frame groove into which the heat sink, in particular a lateral tab of the heat sink, is inserted, wherein the heat sink support frame is connected to the housing in a fluid-tight manner.

The design of the heat sink support as a heat sink support frame is an alternative to the design of the heat sink support as a heat sink support tray.

Like the heat sink support tray, the heat sink support frame provides a particularly effective accommodation of the heat sink, wherein the heat sink accommodated within the heat sink support frame is herein formed in particular as a cast component.

In one form, the heat sink support frame features a frame opening formed within the frame groove, into which the heat sink is placed.

A particularly effective cooling performance of the cooling array is provided through the heat sink support frame, as the heat sink accommodated in the heat sink support frame is in particular directly thermally coupled to the electronic component.

In one form, the frame groove is bounded by a first groove wall, which rests on one heat sink underside of the heat sink, in particular on a heat sink underside of the lateral tab of the heat sink, and the frame groove is bounded by a second groove wall, which rests on one heat sink topside of the heat sink, In one form, on a heat sink topside of the lateral tab of the heat sink.

Thus both groove walls surround the heat sink underside and the heat sink topside of the heat sink at least partially and thus effectively firmly secure the heat sink, in particular the lateral tab of the heat sink.

In one form, the heat sink support, such as the heat sink support tray or the heat sink support frame, features a contact flange which rests on the housing and is connected to the housing in a fluid-tight manner.

The contact flange can in particular be advantageously designed such that a particularly effective fluid-tight connection between the heat sink support and the housing can be provided.

In particular, a housing opening is formed in the housing in which the heat sink support is accommodated, and the contact flange rests against a contact rib of the housing which at least partially surrounds the housing opening, so that a particularly effective fluid-tight connection between the contact flange and the contact rib can be provided.

In one form, the housing features a housing opening in which the heat sink support is accommodated, or the housing and the heat sink support are formed as a single piece.

By inserting the heat sink support into the housing opening, a flexible and subsequently fluid-tight connection of the heat sink support to the housing can be provided.

Alternatively, the heat sink support can be designed as being a single piece with the housing, so that an effective particularly fluid-tight integration of the heat sink support into the housing is made possible.

In one form, a thermally conductive intermediate layer is disposed between the heat sink and the electronic component in order to improve the thermal coupling between the electronic component and the heat sink, wherein the thermally conductive intermediate layer is in particular directly affixed to the heat sink, or wherein the thermally conductive intermediate layer is in particular directly affixed to a tray base of a heat sink support formed as a heat sink support tray.

The direct fixation of the thermally conductive intermediate layer on the heat sink is possible if the heat sink support is designed as a heat sink support frame which is only affixed on lateral tabs of the heat sink, so that the middle of the heat sink underside of the heat sink is not covered by the heat sink support frame. Thus the heat sink, in particular the middle of the heat sink underside of the heat sink, is in direct thermally conductive contact with the thermally conductive intermediate layer, whereby a particularly effective thermal conductivity between the heat sink and the electronic component can be achieved.

If, however, the thermally conductive intermediate layer is affixed to the tray base of a heat sink support formed as a heat sink support tray, then the heat being conducted from the electronic component via the thermally conductive intermediate layer may first pass through the tray base before the heat can be dispersed via the heat sink. The tray base herein features in particular an advantageous thermal conductivity.

The thermally conductive intermediate layer is designed in particular as an elastic thermally conductive intermediate layer, which in particular provides a tolerance compensation between the electronic component and the heat sink or rather the heat sink support.

In one variation, the heat sink is connected to the heat sink support in a materially-bonded manner, in particular with a welded connection and/or a glued connection, in a form-fitting manner, and/or in a friction-locking manner.

Thus, a particularly effective connection between the heat sink and the heat sink support can be provided.

In one variation, the heat sink is formed as an extruded section or as a cast body.

In another variation, the heat sink features a plurality of cooling fins which are disposed in particular on a side of the heat sink which faces away from the heat sink support. A particularly effective dispersal of heat can be provided by the cooling fins.

In one variation, the housing is formed as a cup housing for accommodating a fluid container.

Due to the fluid-tight connection between the heat sink support and the housing, which is designed as a cup housing, it can be provided that any fluid leaking from the fluid container cannot reach the electronic component.

Further areas of applicability will become apparent from the description provided herein. It should be understood that the description and specific examples are intended for purposes of illustration only and are not intended to limit the scope of the present disclosure.

DRAWINGS

Figure 2:
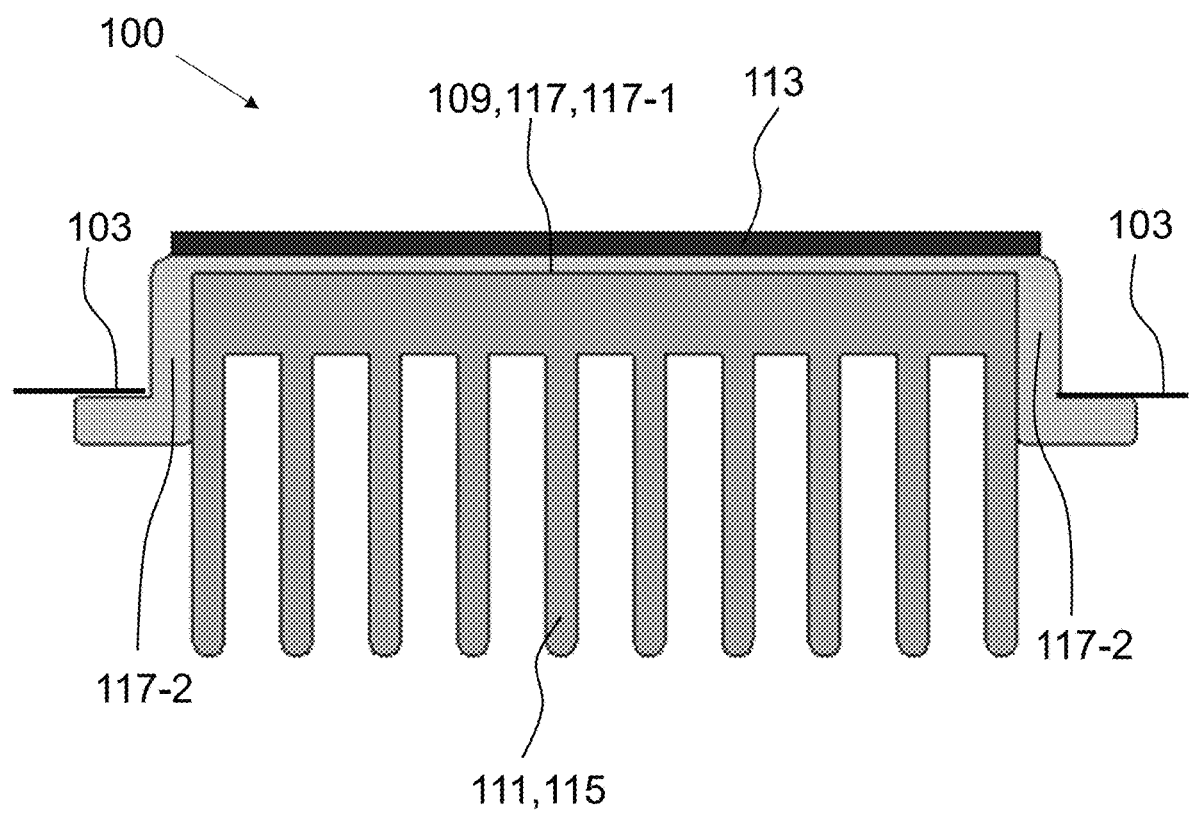
Figure 3:
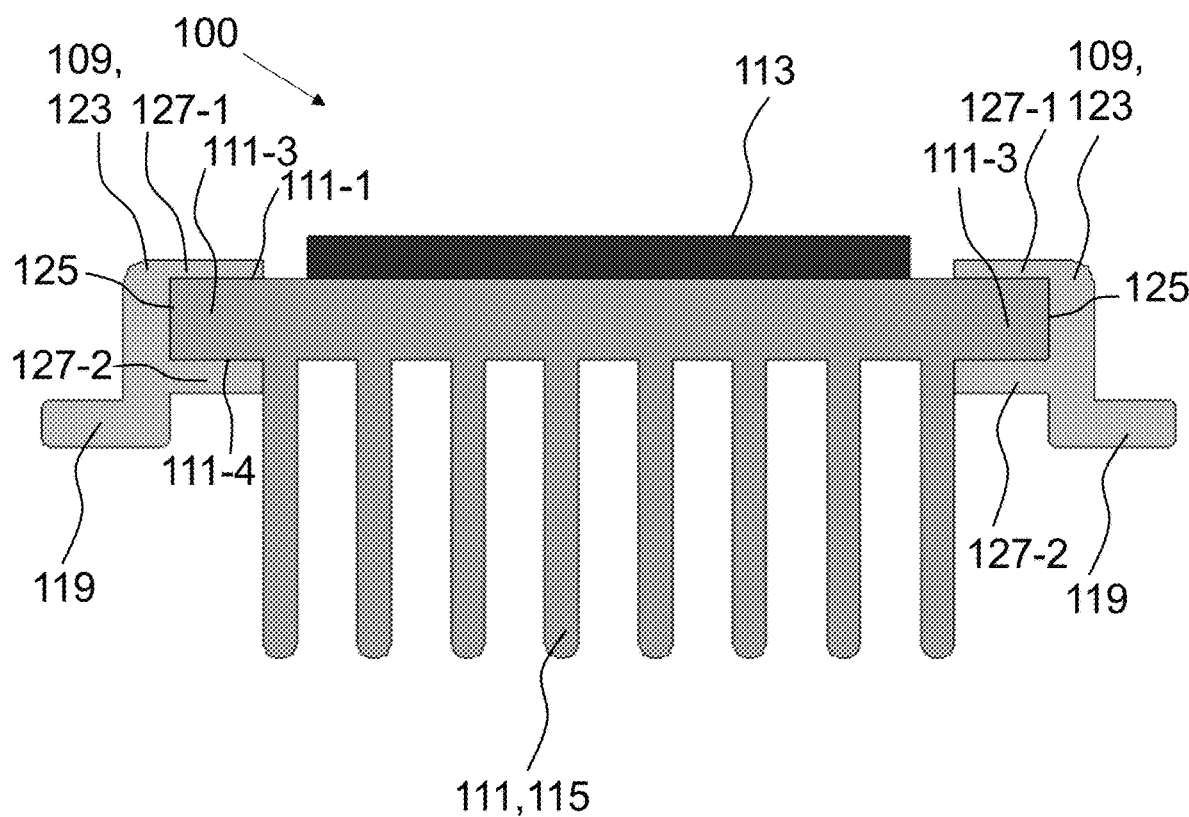
Figure 4:
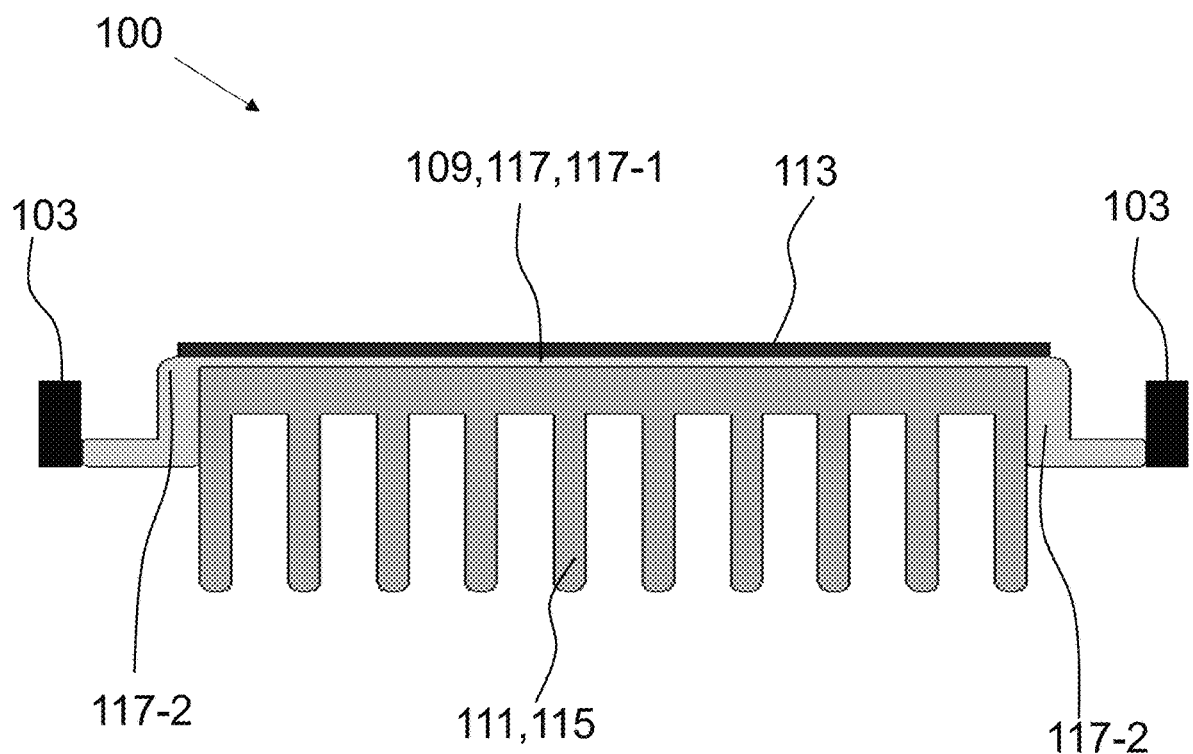
Figure 5:
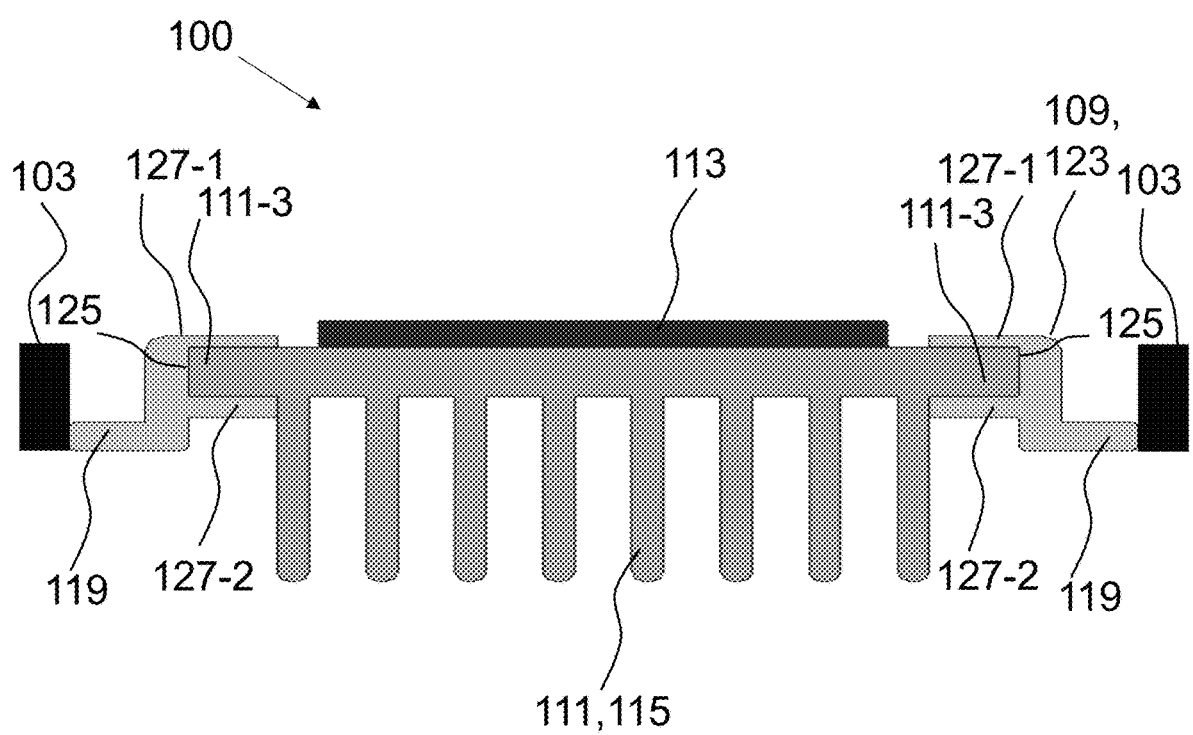

In order that the disclosure may be well understood, there will now be described various forms thereof, given by way of example, reference being made to the accompanying drawings, in which:

FIG. 1 a schematic depiction of a cooling array according to a first exemplary form of the present disclosure;

FIG. 2 a schematic depiction of a cooling array according to a second exemplary form of the present disclosure;

FIG. 3 a schematic depiction of a cooling array according to a third exemplary form of the present disclosure;

FIG. 4 a schematic depiction of a cooling array according to a fourth exemplary form of the present disclosure; and FIG. 5 a schematic depiction of a cooling array according to a fifth exemplary form of the present disclosure.

The drawings described herein are for illustration purposes only and are not intended to limit the scope of the present disclosure in any way.

DETAILED DESCRIPTION

The following description is merely exemplary in nature and is not intended to limit the present disclosure, application, or uses. It should be understood that throughout the drawings, corresponding reference numerals indicate like or corresponding parts and features.

In the following detailed description, reference will be made to the accompanying figures which make up a portion of said description and in which specific variations are shown as an illustration, in which the present disclosure can be presented in detail. It should be understood that other forms can be used and structural or logical changes can be made without deviating from the concept of the present disclosure. The following detailed description therefore should not be understood in a limiting sense. Furthermore, it should be understood that the features of the various exemplary forms and variations described here can be combined with one another, insofar as it is not specifically noted otherwise.

The aspects and variations of the present disclosure are described in reference to the figures, wherein the same reference numerals in general correspond to identical elements. In the following description, numerous specific details are presented for the purposes of explanation, in order to provide an in-depth understanding of one or more aspects of the present disclosure.

In some instances, a plurality of electronic components, such as, for example, power distributors, or rather circuit breakers, generate heat during their operation, which leads to an undesirable warming of the plurality of electronic components. Accordingly, effective cooling of the electronic components is desired.

FIG. 1 shows a perspective depiction of a cooling array according to a first exemplary form.

The cooling array 100 depicted in FIG. 1 is designed for cooling of the electronic components 101 and features the electronic component 101.

The electronic component 101 is disposed in a housing 103 of the cooling array 100, which at least partially surrounds the electronic component 101. In FIG. 1, the housing 103 is only shown sectionally. The housing 103 features a housing opening 105. The housing 103 can be in particular part of a cup housing for accommodating a fluid container, so that a particularly effective fluid-tight enclosure of the electronic component 101 within the housing 103 is provided. In one form, the housing 103 is formed in particular at least partially from a plastic material.

The electronic component 101 is disposed within the housing 103 on a support element 107.

The cooling array 100 furthermore comprises a heat sink support 109 which is connected to the housing 103, wherein the heat sink support 109 is accommodated in particular at least partially within the housing opening 105 of the housing 103.

In one form, the heat sink support 109 is formed in particular at least partially from a plastic material.

According to the teaching of the present disclosure, a fluid-tight connection between the heat sink support 109 and the housing 103 is present in order to inhibit the ingress of fluid to the electronic component 101.

The fluid-tight connection between the heat sink support 109 and the housing 103 comprises at least one of the following connections: a materially-bonded connection, in particular a welded connection and/or a glued connection; a friction-locking connection, in particular a screw connection or a snap connection; and/or a form-fitting connection, in particular a clip connection and/or a caulked connection.

With normal requirements for fluid-tightness, the fluid-tight connection between the heat sink support 109 and the housing 103 can comprise in particular a friction-locking connection, in particular a screw connection or a snap connection, and/or a form-fitting connection, in particular a clip connection and/or a caulked connection.

For particularly strict requirements for fluid-tightness, the fluid-tight connection between the heat sink support 109 and the housing 103 can be in particular a materially-bonded connection, in particular a welded connection and/or a glued connection.

For particularly strict requirements for fluid-tightness, a sealing element—not depicted in FIG. 1—can be disposed in particular between the heat sink support 109 and the housing 103, which comprises in particular a labyrinth seal and/or a two-component seal. In one form, a corresponding sealing element can in particular comprise at least partially silicone.

The cooling array 100 further comprises a heat sink 111, which is accommodated within the heat sink support 109. The heat sink 111 is thermally coupled to the electronic component 101 in order to disperse heat generated by the electronic component 101. The heat sink 111 is formed in particular at least partially from a metal or a metal alloy, in particular aluminum.

In particular, the heat sink 111 is inserted into the heat sink support 109 perpendicularly to the lateral extension of the electronic component 101.

Upon insertion of the heat sink 111, a tolerance compensation can be provided for the heat sink support 109.

In particular, the heat sink 111 is connected in a materially-bonded manner, in particular molded, with the heat sink support 109, or the heat sink 111 is connected to the heat sink support 109 in a form-fitting or friction-locking manner.

The cooling array 100 further comprises a thermally conductive intermediate layer 113 which is disposed between the electronic component 101 and the heat sink 111, in particular between the electronic component 101 and the heat sink support 109. The thermally conductive intermediate layer 113 improves in particular the thermal coupling between the heat sink 111 and the electronic component 101. Additionally the thermally conductive intermediate layer 113 provides a tolerance compensation between the heat sink support 109 and the electronic component 101.

In one form, the thermally conductive intermediate layer 113 is formed in particular from an elastic material.

In summary, it can be noted that the heat generated by the electronic component 101 can be conducted to the heat sink 111 via the in particular thermally conductive intermediate layer 113, via the heat sink support 109, wherein the heat sink 111 disperses or radiates the heat conducted thereto. In particular, the heat sink 111 hereby features a plurality of cooling fins 115, through which the conducted heat can be radiated in a particularly effective manner. The heat sink 111 depicted in FIG. 1 is hereby formed in particular as an extruded section, which provides a cost-effective production of the heat sink 111.

As can be seen from FIG. 1, the heat sink support 109 is formed as a heat sink support tray 117, which features a tray base 117-1, on which a heat sink underside 111-1 of the heat sink 111 rests, and which features a tray side wall 117-2 which at least partially surrounds the tray base 117-1, on which a heat sink lateral side 111-2 of the heat sink 111 rests.

In order to provide the heat transfer through the tray base 117-1 of the heat sink support tray 117, the tray base 117-1 features in particular a reduced thickness in comparison to the tray side wall 117-2.

In order to provide the fluid-tight connection between the heat sink support 109 and the housing 103, the tray side wall 117-2 is connected to the housing 103 in a fluid-tight manner.

In particular, the tray side wall 117-2 hereby features a contact flange 119 which rests on the housing 103, in particular on a contact rib 121 of the housing 103 surrounding the housing opening 105. The contact flange 119 is hereby connected to the housing 103, in particular to the contact rib 121 in a fluid-tight manner.

With the heat sink array 100 depicted in FIG. 1, the advantage is achieved that only one fluid-tight sealing location must be designed between the heat sink support 109 and the housing 103, whereas there does not need to be any fluid-tight seal between the heat sink support 109 and the heat sink 111.

Additionally, no machining of the heat sink 111 is needed in the heat sink array 100 depicted in FIG. 1, but rather an effective installation of the heat sink 111 into the heat sink support 109 can be achieved due to the tolerance compensation.

FIG. 2 shows a perspective depiction of a cooling array according to a second exemplary form.

The cooling array 100 depicted in FIG. 2 according to the second exemplary form corresponds to the cooling array 100 depicted in FIG. 1 according to the first exemplary form, wherein however the housing 103 in FIG. 2 is only depicted schematically, and wherein the electronic component 101 is not depicted in FIG. 2.

Due to the design of the heat sink support 109 as a heat sink support tray 117, the heat sink 111 accommodated in the heat sink support tray 117 can be formed as an economically producible extruded section, whereby the costs can be reduced.

For additional details refer to the discussion regarding FIG. 1.

FIG. 3 shows a perspective depiction of a cooling array according to a third exemplary form.

In the cooling array 100 depicted in FIG. 3, the housing 103 and the electronic component 101 are not depicted.

The cooling array 100 depicted in FIG. 3 comprises a heat sink support 109, which is formed as a heat sink support frame 123 which features a frame groove 125 into which the heat sink 111, in particular a lateral tab 111-3 of the heat sink 111, is inserted, wherein the heat sink support frame 109 is connected to the housing 103 in a fluid-tight manner.

The frame groove 125 is bounded by a first groove wall 127-1 and by a second groove wall 127-2 of the heat sink support frame 123. The first groove wall 127-1 rests on a heat sink underside 111-1 of the lateral tab 111-3 of the heat sink 111. The second groove wall 127-2 rests on a heat sink topside 111-4 of the lateral tab 111-3 of the heat sink 111.

The heat sink 111 depicted in FIG. 3 is manufactured from a cast component.

As can be seen in FIG. 3, the thermally conductive intermediate layer 113 is affixed directly to the heat sink 111 and thus makes possible a particularly advantageous thermal conductivity between the electronic component 101 and the heat sink 111, so that a high degree of cooling performance can be provided by the cooling array 100.

As can be seen in FIG. 3, the heat sink support 109 designed as a heat sink support frame 123 features a contact flange 119 which lies on the housing 103—not depicted in FIG. 3—and thus is connected in a fluid-tight manner, in particular lying on a contact rib 121 of the housing 103 which at least partially surrounds the housing opening 105, and is thus connected in a fluid-tight manner.

For additional details refer to the comprehensive variations in FIGS. 1 and 2.

FIG. 4 shows a perspective depiction of a cooling array according to a fourth exemplary form.

The cooling array depicted in FIG. 4 according to the fourth exemplary form corresponds to the cooling array 100 depicted in FIG. 1 according to the first exemplary form, wherein however the housing 103 in FIG. 4 is only depicted schematically, and wherein the electronic component 101 is not depicted in FIG. 4.

The cooling array 100 depicted in FIG. 4 differs from the cooling array 100 depicted in FIG. 1 and FIG. 2 in that the heat sink support 109 which is designed as a heat sink support tray 117 is designed as being a single piece with the housing 103. Thus, the heat sink support 109 and the housing 103 are designed to be integral.

For additional variations refer to the comprehensive variations in FIGS. 1 and 2.

FIG. 5 shows a perspective depiction of a cooling array according to a fifth exemplary variation.

The cooling array depicted in FIG. 5 according to the fifth exemplary variation corresponds to the cooling array 100 depicted in FIG. 3 according to the third exemplary variation, wherein however the housing 103 in FIG. 5 is only depicted schematically, and wherein the electronic component 101 is not depicted in FIG. 5.

The cooling array 100 depicted in FIG. 5 differs from the cooling array 100 depicted in FIG. 3 in that the heat sink support 109 which is designed as a heat sink support frame 123 is designed as being a single piece with the housing 103.

For additional forms refer to the comprehensive forms in FIG. 3 and/or FIGS. 1 and 2, respectively.

Unless otherwise expressly indicated herein, all numerical values indicating mechanical/thermal properties, compositional percentages, dimensions and/or tolerances, or other characteristics are to be understood as modified by the word "about" or "approximately" in describing the scope of the present disclosure. This modification is desired for various reasons including industrial practice, material, manufacturing, and assembly tolerances, and testing capability.

As used herein, the phrase at least one of A, B, and C should be construed to mean a logical (A OR B OR C), using a non-exclusive logical OR, and should not be construed to mean "at least one of A, at least one of B, and at least one of C."

The apparatuses and methods described in this application may be partially or fully implemented by a special purpose computer created by configuring a general-purpose computer to execute one or more particular functions embodied in computer programs. The functional blocks, flowchart components, and other elements described above serve as software specifications, which can be translated into the computer programs by the routine work of a skilled technician or programmer.

The description of the disclosure is merely exemplary in nature and, thus, variations that do not depart from the substance of the disclosure are intended to be within the scope of the disclosure. Such variations are not to be regarded as a departure from the spirit and scope of the disclosure.

What is claimed is:

1. A cooling array for cooling of an electronic component, the cooling array comprising:
   the electronic component;
   a housing at least partially enclosing the electronic component;
   a heat sink support connected to the housing in a fluid-tight manner; and
   a heat sink accommodated in the heat sink support, wherein:
   the heat sink is thermally coupled to the electronic component in order to disperse heat generated by the electronic component,
   the heat sink support is a heat sink support tray, the heat sink support tray comprising a tray base with a heat sink underside of the heat sink resting thereon, the heat sink support tray comprising a tray side wall that at least partially surrounds the tray base, on which a heat sink lateral side of the heat sink rests,
   the heat sink support tray comprises a plurality of contact flanges extending laterally outward from the tray side wall and connected to the housing in a fluid-tight manner,
   the housing comprises a plurality of contact ribs that define a housing opening,
   the tray base is entirely disposed within the housing opening, and
   the plurality of contact flanges located outside of the housing opening and connected to the plurality of contact ribs of the housing in the fluid-tight manner.

2. The cooling array according to claim 1, wherein the fluid-tight manner between the heat sink support and the housing comprises at least one of a materially-bonded connection, a friction-locking connection, and a form-fitting connection.

3. The cooling array according to claim 2, wherein the materially-bonded connection comprises a welded connection or a glued connection.

4. The cooling array according to claim 2, wherein the friction-locking connection comprises a screw connection or a snap connection.

5. The cooling array according to claim 2, wherein the form-fitting connection comprises a clip connection or a caulked connection.

6. The cooling array according to claim 1, wherein a sealing element is disposed between the heat sink support and the housing, in order to generate a fluid-tight connection between the heat sink support and the housing, wherein the sealing element comprises a labyrinth seal or a two-component seal.

7. The cooling array according to claim 1, wherein the housing and the heat sink support are a single piece.

8. The cooling array according to claim 1, further comprising a thermally conductive intermediate layer disposed between the heat sink and the electronic component in order to improve the thermal coupling between the electronic component and the heat sink, wherein the thermally conductive intermediate layer is directly affixed to the heat sink.

9. The cooling array according to claim 1, further comprising a thermally conductive intermediate layer disposed between the heat sink and the electronic component in order to improve the thermal coupling between the electronic component and the heat sink, wherein the thermally conductive intermediate layer is directly affixed to the tray base.

10. The cooling array according to claim 1, wherein the heat sink is connected to the heat sink support in a materially-bonded manner, in a form-fitting manner or in a friction-locking manner.

11. The cooling array according to claim 10 wherein the materially-bonded manner comprises a welded connection or a glued connection.

12. The cooling array according to claim 1, wherein the heat sink is one of an extruded section and a cast body.

13. The cooling array according to claim 1, wherein the heat sink comprises a plurality of cooling fins disposed on a side of the heat sink facing away from the heat sink support.

14. The cooling array according to claim 1, wherein the housing is a cup housing for accommodating a fluid container.

15. A cooling array for cooling of an electronic component, the cooling array comprising:
    the electronic component;
    a housing at least partially enclosing the electronic component;
    a heat sink support connected to the housing in a fluid-tight manner; and
    a heat sink accommodated in the heat sink support, wherein:
    the heat sink is thermally coupled to the electronic component in order to disperse heat generated by the electronic component,
    the heat sink support is a heat sink support frame, the heat sink support frame having a frame groove into which a lateral tab of the heat sink is inserted, the heat sink support frame is connected to the housing in a fluid-tight manner,
    the heat sink support frame comprises a contact flange that lies on the housing and is connected to the housing in a fluid-tight manner,
    the housing comprises a plurality of contact ribs that define a housing opening,
    the frame groove is entirely disposed within the housing opening, and
    the contact flange is located outside of the housing opening and is connected to the plurality of contact ribs of the housing in the fluid-tight manner.

16. The cooling array according to claim 15, wherein the frame groove is bounded by a first groove wall that lies on a heat sink underside of the lateral tab of the heat sink, and wherein the frame groove is bounded by a second groove wall that lies on a heat sink topside of the lateral tab of the heat sink.

* * * * *